(12) United States Patent
Parker et al.

(10) Patent No.: US 6,424,569 B1
(45) Date of Patent: *Jul. 23, 2002

(54) USER SELECTABLE CELL PROGRAMMING

(75) Inventors: Allan Parker, Austin; Joseph Skrovan, Buda, both of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/513,027

(22) Filed: Feb. 25, 2000

(51) Int. Cl.$^7$ ............................................. G11C 16/04
(52) U.S. Cl. ............................ 365/185.18; 365/185.19; 365/185.24
(58) Field of Search ..................... 365/185.18, 185.19, 365/185.17, 185.24, 185.03

(56) References Cited

U.S. PATENT DOCUMENTS

| | | | |
|---|---|---|---|
| 5,302,870 A | 4/1994 | Chern | 307/530 |
| 5,429,968 A | 7/1995 | Koyama | 437/48 |
| 5,457,650 A | 10/1995 | Sugiura et al. | 365/184 |
| 5,523,972 A | 6/1996 | Rashid et al. | 365/185.22 |
| 5,596,526 A | 1/1997 | Assar et al. | 365/185.17 |
| 5,602,789 A | 2/1997 | Endoh et al. | 365/201 |
| 5,689,679 A | 11/1997 | Jouppi | 395/449 |
| 5,815,436 A | 9/1998 | Tanaka et al. | 365/185.03 |
| 5,831,900 A | 11/1998 | Miyamoto | 365/185.03 |
| 5,847,992 A | 12/1998 | Tanaka et al. | 365/185.03 |
| 5,852,575 A | 12/1998 | Sugiura et al. | 365/184 |
| 5,870,407 A * | 2/1999 | Hsia | 365/201 |
| 5,949,101 A | 9/1999 | Aritome | 257/315 |
| 5,986,929 A | 11/1999 | Sugiura et al. | 365/185.03 |
| 6,026,015 A | 2/2000 | Hirakawa | 365/185.03 |
| 6,028,792 A | 2/2000 | Tanaka et al. | 365/185.22 |
| 6,163,485 A * | 12/2000 | Kawahara | 365/185.24 |
| 6,219,276 B1 * | 4/2001 | Parker | 365/185.03 |

FOREIGN PATENT DOCUMENTS

| | | | |
|---|---|---|---|
| JP | 10106276 A | 4/1998 | G11C/17/00 |
| WO | WO 99/07000 | 2/1999 | |

* cited by examiner

Primary Examiner—A. Zarabian

(57) ABSTRACT

A user selectable option to a memory cell, such as a multilevel NAND flash cell, that allows the user to select to optimize programming time or the data integrity. A programmable memory cell can have multiple programming modes. A mode selector can switch the programming of each cell or group of cells between the programming modes. A first programming mode can program the cell with a first programming voltage and maintaining at least a fifty percent of the maximum data margin. A second programming mode can program the cell with a second programming voltage and maintaining at least an eighty five percent of the maximum data margin. The first programming voltage can be greater than the second programming voltage.

15 Claims, 3 Drawing Sheets

USER SELECTABLE CELL PROGRAMMING

BACKGROUND

A flash cell can be a field effect transistor (FET) including a select gate, a floating gate, a drain, and a source. A cell can be read by grounding the source, and applying a voltage to a bitline connected with the drain. By applying a voltage to the wordline connected to select gate, the cell can be switched on and off.

Flash memory cells can be grouped into NAND type and NOR type circuits. NAND flash memory cells have an n cell transistors connected in series and are connected in parallel between bit lines and ground lines. NAND flash memory cells are useful in large scale integration. NOR flash memory cells include cell transistors that are connected in parallel between bit lines and ground lines. NOR flash memory cells provide high-speed operation.

Programming a cell includes trapping excess electrons in the floating gate to increase voltage. This reduces the current conducted by the memory cell when the select voltage is applied to the select gate. The memory cell is programmed when the cell current is less than a reference current and the select voltage is applied. The cell is erased when the cell current is greater than the reference current and the select voltage is applied.

Memory cells with only two programmable states contain only a single bit of information, such as a "0" or a "1".

A multi-level cell ("MLC") is a cell that can be programmed with more than one voltage level. Each voltage level is mapped to corresponding bits of information. For example, a multi-level cell can be programmed with one of four voltage levels, −2.5V, 0.0V, +1.0V, +2.0V that correspond to binary "00", "01", "10", and "11", respectively. A cell that is programmable at more voltage levels can store more bits of data based on the following equation:

$$N=2^B \qquad \text{Eqn. 1}$$

B is the number of bits of data stored
N is the number of voltage levels.

The amount of data stored in a cell can be increased by using more than two programming states. Thus, two or more bits of data are stored in each cell. A cell with four states requires three threshold levels. U.S. Pat. Nos. 5,043,940 and 5,172,338 described such cells and are incorporated herein by this reference.

More time is required to program a cell with more states to avoid overshooting a desired smaller programming range. To insure that the cell is programmed properly, the cell is programmed beyond the threshold level. This technique tends to increase the programming time since the required programming accuracy is increased.

FIG. 1 shows a representation of a four level multilevel cell program voltage diagram 100. The program voltage distribution ("distribution") of the four levels are shown between lines 102 and 104, 106 and 108, lines 110 and 112, and above line 114, respectively. The programming distribution can be for example 100 mV to 600 mV wide. A four level multilevel memory cell can be programmed with any one of these voltage levels. Because the cell can store one of four binary values it can store 2 bits of information. The data margin ("margin"), also called a guard band, is the voltage levels between distributions that is not normally used. The margins are shown in FIG. 1 between lines 104 and 106; lines 108 and 110; and lines 112 and 114. For example, the data margin can be 800 mV to 100 mV wide.

FIG. 2 shows the affect of the phenomena called "read disturb." Read disturb occurs after the cell has been read many times without being reprogrammed. The programming distributions are shifted to the right, which represents a positive voltage shift. Distributions 230, 232, 234, and 236 represent the distributions 220, 222, 224, and 226 after they have been affected by the read disturb. Eventually, the read disturb can become so severe that the stored data becomes unreliable, such as at lines 210 and 212.

FIG. 3 shows the affect of the phenomena called "data retention." Data retention causes the distributions 220, 222, 224, and 226 to be shifted to the left as shown by distributions 320, 322, 324, and 326, which represents a negative voltage shift. Over time if the cell is not reprogrammed, the data retention shift can cause the stored data to become unreliable.

BRIEF SUMMARY OF THE PREFERRED EMBODIMENTS

A user selectable option is added to a memory cell, such as a multilevel NAND flash cell, that allows the user to select whether to optimize programming time or the data integrity.

A mode selection mechanism can switch the programming mode of each cell. A first programming mode programs the cell with a first programming voltage and maintains at least fifty percent of the maximum data margin. A second programming mode programs the cell with a second programming voltage and maintains at least eighty five percent of the maximum data margin. The first programming voltage is greater than the second programming voltage.

BRIEF DESCRIPTION OF SEVERAL VIEWS OF THE DRAWINGS

The present invention is illustrated by way of example and not limitation in the accompanying figures. In the figures, like reference numbers indicate identical or functionally similar elements. Additionally, the left-most digit(s) of a reference number identifies the figure in which the reference number first appears.

DESCRIPTION OF THE PREFERRED EMBODIMENTS

To overcome the short coming of the state of the art memory devices, it is desirable to program memory cells using one of a variety of methods depending on the characteristics of the data to be stored. Some data, such as real time audio recordings (voice, music, etc.), require faster programming time, while data retention is less important. Other data, such as computer programs, need superior data retention because the data is stored for an extended period and it is accessed many times, while initial programming time is less important. Thus, it is desirable for a memory cell to programmed in a variety of manners depending on the characteristics of the data to be stored.

Figure 1:
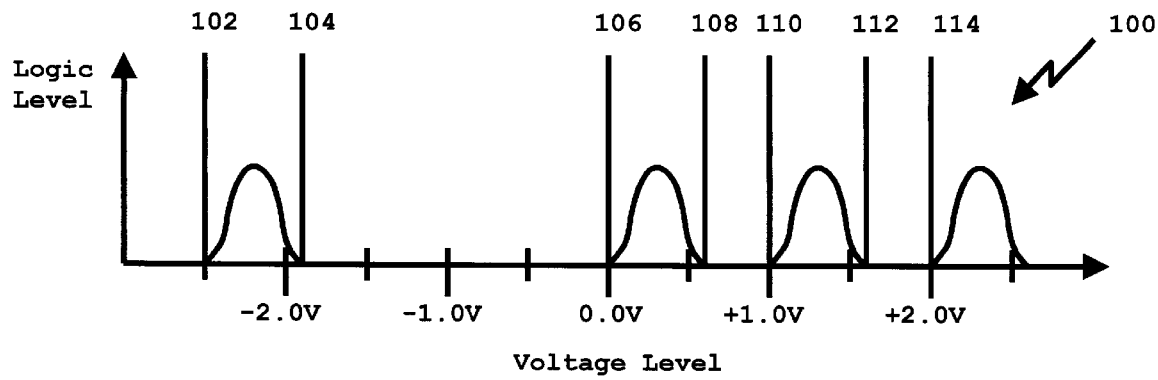
FIG. 1 is a representation of the programmable voltage levels of a multi-level cell.
Figure 2:
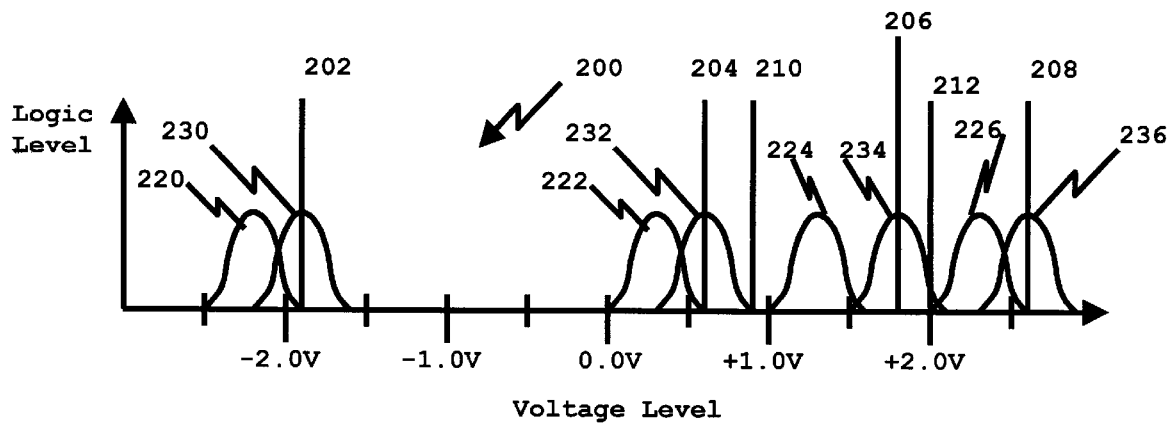
FIG. 2 is a representation of the programmable voltage levels of a multi-level cell with a positive voltage shift.
Figure 3:
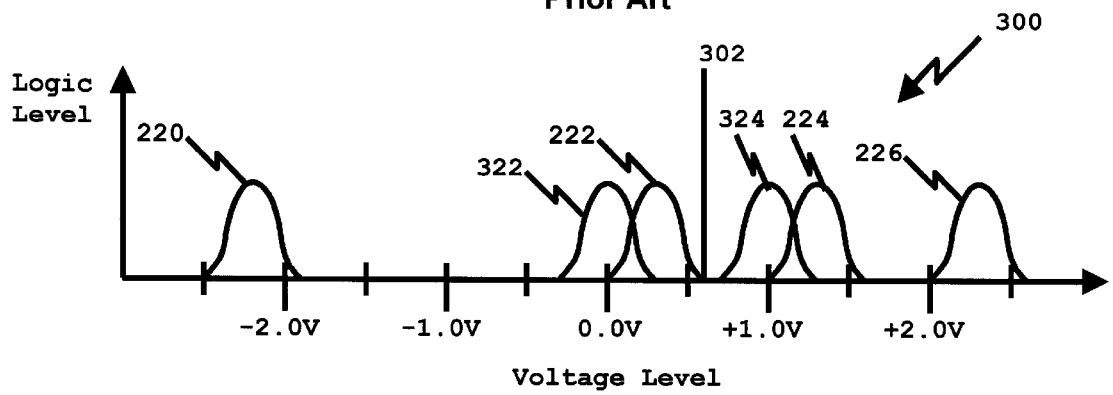
FIG. 3 is a representation of the programmable voltage levels of a multi-level cell with a negative voltage shift.
Figure 4:
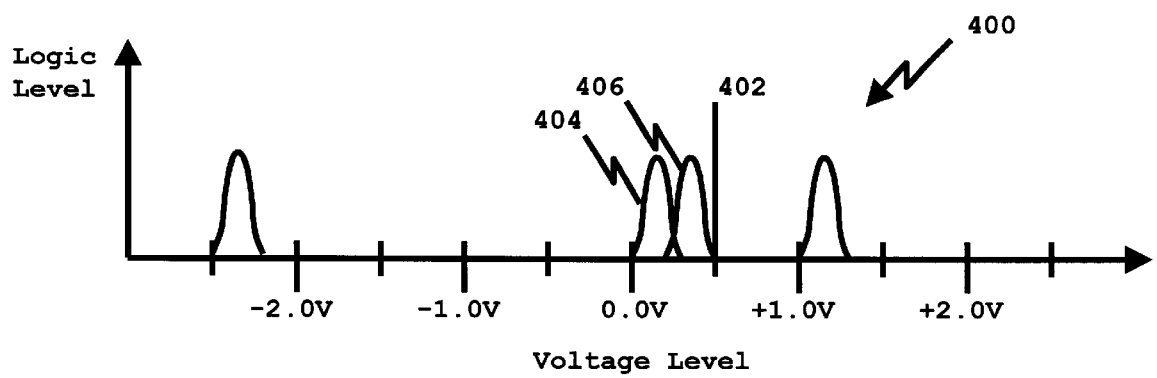
FIG. 4 is a representation of the programmable voltage levels of a multi-level cell with a positive voltage shift that does not cause a read error.
Figure 5:
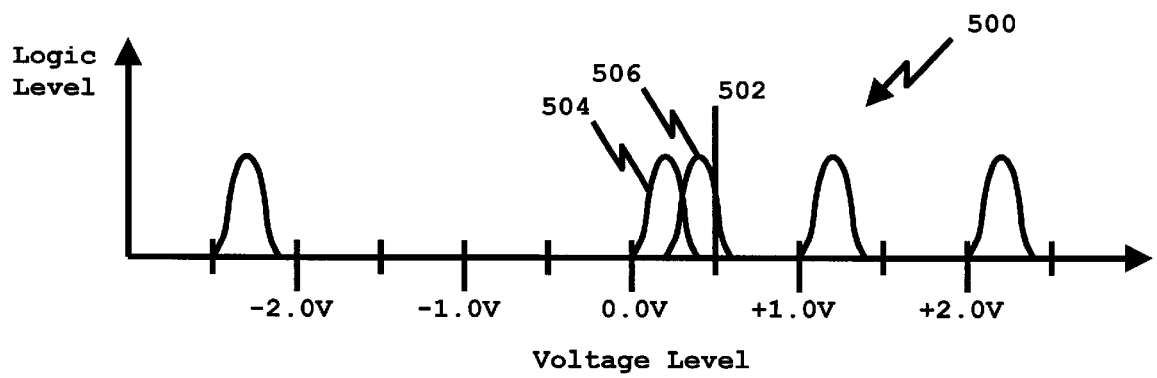
FIG. 5 is a representation of the programmable voltage levels of a multi-level cell with a positive voltage shift that causes a read error.

Because the voltage levels of the stored data can shift to the left or the right as shown in FIGS. 2 and 3, it is beneficial to have narrower program distributions and thus wider program margins. FIGS. 4 and 5 illustrate this. FIG. 4 has program distributions of approximately 200 mV, while FIG. 5 has program distributions of 400 mV. If the program distributions 404 and 504 in FIG. 4 and 5 respectfully are shifted to the right by 100 mVs, the data distribution 406 in FIG. 4 will still be read properly at read point 402, while the data distribution 506 in FIG. 5 will be read incorrectly at read point 502. The read points 402 and 502 represent the threshold voltage value that separate the zero volt distribution from the one volt distributions. That is, if the voltage is above the read point the cell is read as the two bits associated with the one volt distribution and if the read voltage is below the read point then the cell is read as the two bits associated with the zero volt distribution.

While the narrower program distributions of FIG. 4 are more reliable than those of FIG. 5, to achieve the narrower program distributions require longer programming time. Programming time is the time required to program a cell to a voltage within a valid program distribution. A cell is programmed by applying one or more pulses at a voltage level. The voltage level of the pulses is often much higher then the voltage distribution. For example, to program a cell to the one volt distribution, 2 pulses at 20V can be used.

However, to achieve a narrower program distribution, 20 pulses at 16V may be used. Thus, a fundamental trade off is made between programming speed and program margin.

Figure 6:
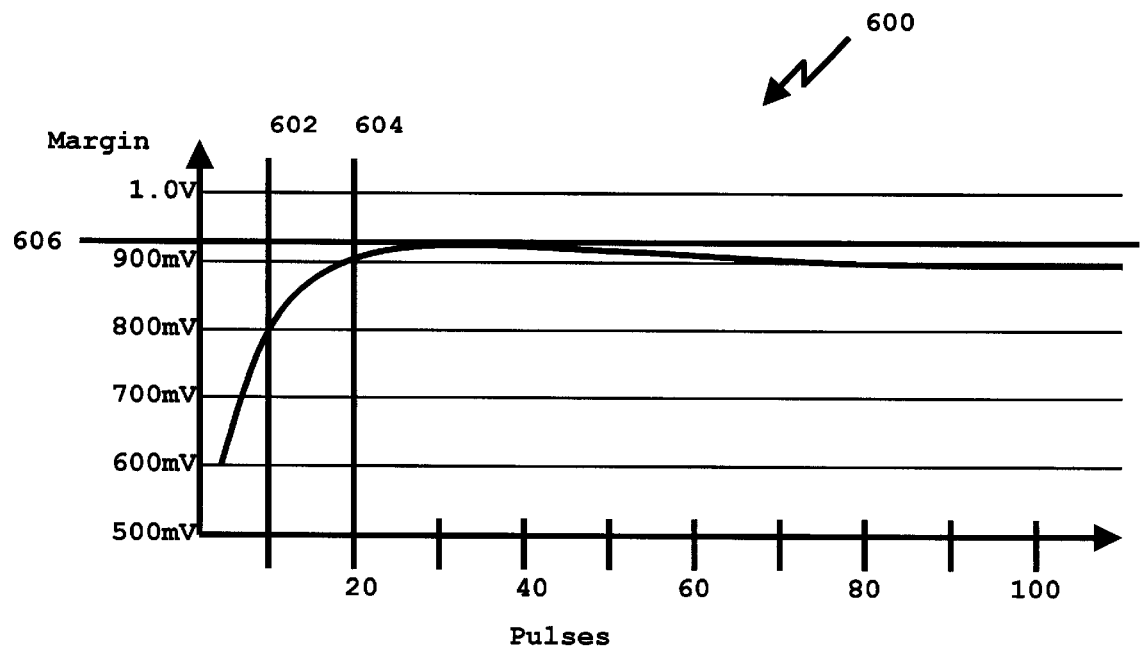
FIG. 6 is a representation of the voltage margin per pulse count.

FIG. 6 shows the relation of the programming pulse count to the data margin for a multilevel NAND flash cell. The maximum data margin is represented by line 606 and occurs between thirty and forty pulses. The data margin falls off slightly after forty pulses because of program disturb. Line 606 represents a data margin of approximately 940 mV, which is the maximum data margin. At line 602 ten pulses have programmed the cell to approximately 85% of the maximum data margin, approximately 800 mV. At line 604 twenty pulses have programmed the cell to approximately 95% of the maximum data margin, approximately 895 mV. The 85% and 95% points are significant, regardless of the memory cell type, for determining how many pulses should be used for optimizing between programming time and data margin.

A multi-mode cell can be programmed in at least two programming modes. The first programming mode minimizes programming time and the second programming mode maximizes data margin.

To minimize programming time, the first programming mode uses higher voltage pulses with lower pulse count. Since the pulse count is a significant factor in the programming time, as the pulse count decreases, the cell will be programmed faster. However, to program a cell to a given voltage level, for example 1V, higher voltage levels are required when the pulses count is reduces. The higher voltage pulses and reduced pulse count cause the programming distribution to become wider and thus the data margins become smaller.

To maximize the data margin, the second mode is used. The second mode increases the pulse count and reduces the voltage of the programming pulses. Increasing the pulse count caused the programming distribution to decrease and the data margin to increase. Thus, the data reliability is increased.

The modes can be selected for each cell or preferably for a group of cells storing data with similar reliability and programming time requirements. The modes can be switched on a page by page basis, where a page is a set of cells, commonly 1024 or 4096 cells.

The programming voltage level can vary depending on the characteristics of the cell being programmed.

Figure 7:
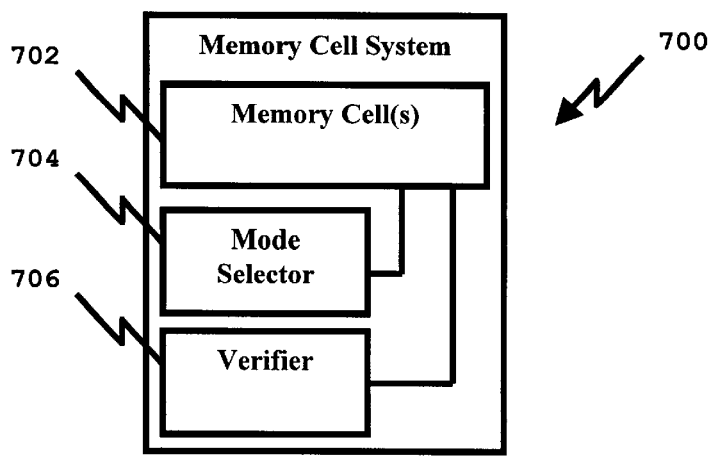
FIG. 7 is a representation of an embodiment of a memory cell system, a mode selector, and an optional verifier.

FIG. 7 shows a memory cell system 700 that includes memory cells 702, a mode selector 704, and an optional verifier 706. The memory cell system 700 can be implemented for each cell, for a group of cells, for a page of cells, or for all the cells in a memory array. The memory cells 702 is also called a set of memory cells and can include one or more memory cells. The memory cells 702 can be a page of 1024 cells. The mode selector 704 can select the mode for one cell, for a group of cells, or for the array of cells. The mode selector 704 can be integrally fabricated with each memory cell or group of cells. Alternatively, discrete components can be used for the mode selector 704 and the memory cells 702. The optional verifier 706 can verify the programmed voltage level of a single cell or a group of cells after the cell or cells have been programmed. The verifier 706 can be integrally fabricated with each memory cell or group of cells or the verifier 706 can be made of discrete components.

The memory cell system 700 can have multiple programming modes. A mode selector 704 switches the programming of each cell or set of cell between the programming modes. A first programming mode programs the cell with a first programming voltage and maintains at least a fifty percent of the maximum data margin. A second programming mode programs the cell with a second programming voltage and maintains at least eighty five percent of the maximum data margin. The first programming voltage is greater than the second programming voltage.

A method of programming a memory device (array of memory cell or cells) includes selecting a first or second programming mode for programming each memory cell. The first programming mode includes programming memory cells with a first programming voltage and a first pulse count. The second programming mode includes programming the memory cells with a second programming voltage and a second pulse count. The first programming voltage is greater than the second programming voltage and the second pulse count is greater than the first pulse count. A first group of cells are programmed in the first programming mode and a second plurality of cells are programmed in the second programming mode. The first programming mode is faster than the second programming mode, for example five to fifty percent faster. In a preferred embodiment, the second programming mode maintains a high data margin, for example eighty to ninety nine percent of the maximum data margin. In another embodiment, the first programming voltage is approximately twenty volts and the second programming voltage is approximately sixteen volts.

In another embodiment, the first programming mode includes using a first set of programming pulses and the second programming mode includes using a second set of programming pulses, the first set of programming pulses having fewer pulses than the second set of programming pulses.

In another embodiment, the first programming mode includes programming the cell with first pulse count and the second mode includes programming the cell with a second pulse count, the second pulse count being greater than the first pulse count. For example, the second pulse count can be five to fifty percent larger than the first pulse count.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A programmable memory cell having a plurality of programming modes comprising:
   (a) a memory cell having a maximum data margin;
   (b) a mode selector that switches programming of the memory cell between at least a first and second programming modes;
   the first programming mode comprises programming the cell with a first programming voltage and maintaining at least fifty percent of the maximum data margin; and
   the second programming mode comprises programming the cell with a second programming voltage and maintaining at least eighty five percent of the maximum data margin, the first programming voltage being greater than the second programming voltage, wherein the first programming mode comprises using a first set of programming pulses and the second programming mode comprises using a second set of programming pulses, the first set of programming pulses having fewer pulses that the second set of programming pulses.

2. The programmable memory cell of claim 1 wherein the second pulse count being at least twice the first pulse count.

3. A method of programming a memory device having a plurality of memory cells, the plurality of memory cells having first and second sets of cells, comprising:
   (a) selecting a first or second programming mode for programming the plurality of memory cells, the first programming mode comprising programming memory cells with a first programming voltage and a first pulse count and the second programming mode comprising programming memory cells with a second programming voltage and a second pulse count, the first programming voltage being greater than the second programming voltage and the second pulse count being greater than the first pulse count;
   (b) programming a first set of cells using the first programming mode; and
   (c) programming a second set of cells using the second programming mode.

4. The method of claim 3 wherein the first programming mode requires less time to program the memory cells than the second programming mode.

5. The method of claim 3 wherein the first programming voltage being at least ten percent greater than the second programming voltage.

6. The method of claim 3 wherein the second pulse count is at least five times greater than the first pulse count.

7. A memory device, comprising:
   (a) a plurality of memory cells being capable of being programmed in a first and second programming mode; the first programming mode comprising using a first programming voltage and a first pulse count and the second programming mode comprising using a second programming voltage and a second pulse count, the first programming voltage being greater than the second programming voltage and the second pulse count being greater than the first pulse count; and
   (b) a mode selector capable of selecting between the first and second programming mode for one or more memory cells.

8. The memory device of claim 7 wherein the mode selector selects a programming mode for each page of cells.

9. The memory device of claim 7 wherein the mode selector is capable of selecting different modes for subsequent programming of the same cell.

10. The memory device of claim 7 wherein the mode selector is user selectable.

11. The programmable memory cell of claim 1 wherein the first programming mode programs the memory cell at least twenty five percent faster than the second programming mode.

12. The programmable memory cell of claim 1 wherein the second programming mode maintaining a data margin of at least ninety five percent of the maximum data margin.

13. The programmable memory cell of claim 1 wherein the cell is a multi-level memory cell.

14. The programmable memory cell of claim 1 wherein the first programming voltage is approximately twenty volts and the second programming voltage is approximately sixteen volts.

15. The programmable memory cell of claim 1 further comprising a verification mechanism for verifying a programmed value in the memory cell.

* * * * *